US012804932B2

(12) United States Patent
Fiorenza et al.

(10) Patent No.: US 12,804,932 B2
(45) Date of Patent: Nov. 17, 2026

(54) HIGH CURRENT AND FIELD-MANAGED TRANSISTOR

(71) Applicant: Analog Devices, Inc., Wilmington, MA (US)

(72) Inventors: James G. Fiorenza, Carlisle, MA (US); Daniel Piedra, Somerville, MA (US)

(73) Assignee: Analog Devices, Inc., Wilmington, MA (US)

( * ) Notice: Subject to any disclaimer, the term of this patent is extended or adjusted under 35 U.S.C. 154(b) by 272 days.

(21) Appl. No.: 18/576,324

(22) PCT Filed: Jan. 6, 2022

(86) PCT No.: PCT/US2022/011466
§ 371 (c)(1),
(2) Date: Jan. 3, 2024

(87) PCT Pub. No.: WO2023/287456
PCT Pub. Date: Jan. 19, 2023

(65) Prior Publication Data

US 2024/0332397 A1 Oct. 3, 2024

Related U.S. Application Data

(60) Provisional application No. 63/203,167, filed on Jul. 12, 2021.

(51) Int. Cl.
*H10D 30/01* (2025.01)
*H10D 30/47* (2025.01)
(Continued)

(52) U.S. Cl.
CPC ......... *H10D 30/015* (2025.01); *H10D 30/475* (2025.01); *H10D 62/8503* (2025.01); *H10D 64/111* (2025.01); *H10D 64/411* (2025.01)

(58) Field of Classification Search
CPC ............................ H10D 30/47; H10D 30/471
See application file for complete search history.

(56) References Cited

U.S. PATENT DOCUMENTS 7,339,207 B2 3/2008 Murata et al.
7,812,371 B2 10/2010 Kaya et al.
(Continued)

FOREIGN PATENT DOCUMENTS

CN 103489911 A 1/2014
CN 105405877 A 3/2016
(Continued)

OTHER PUBLICATIONS

"German Application Serial No. 112022003500.5, Office Action mailed Mar. 26, 2026", w/o English Translation, 4 pgs.
(Continued)

*Primary Examiner* — Yu-Hsi D Sun
(74) *Attorney, Agent, or Firm* — Schwegman Lundberg & Woessner, P.A.

(57) ABSTRACT

A gallium nitride (GaN) semiconductor device, such as a field-effect transistor (FET), is described with a design that can enable the semiconductor device to handle high current and high voltage simultaneously. For example, the device can have highly doped n-type N+ regions to ensure low contact resistance and high current. The semiconductor device can have a lightly conducting region next to the drain side of the gate contact, and the device can have a more highly conducting region further from the edge of the drain side of the gate contact. The semiconductor device can handle high current because of the low contact resistance and highly doped drain region but can handle a high electric field because of the lightly doped region near the drain edge of the gate contact. The semiconductor device can be formed in GaN by forming the original N+/N− structure, and then
(Continued)

etching a portion of it away, and then regrowing the barrier layer.

9 Claims, 8 Drawing Sheets

(51) Int. Cl.

| | |
|---|---|
| ***H10D 62/85*** | (2025.01) |
| ***H10D 64/00*** | (2025.01) |
| ***H10D 64/27*** | (2025.01) |

(56) References Cited

U.S. PATENT DOCUMENTS

| | | | | |
|---|---|---|---|---|
| 7,948,011 | B2 | 5/2011 | Rajan et al. | |
| 7,994,512 | B2 | 8/2011 | Parikh et al. | |
| 8,227,810 | B2 | 7/2012 | Nakata et al. | |
| 8,507,345 | B2 | 8/2013 | Hayashi et al. | |
| 8,927,999 | B2 | 1/2015 | Kizilyalli et al. | |
| 9,214,528 | B2 | 12/2015 | Zhou et al. | |
| 9,543,424 | B2 | 1/2017 | Derluyn et al. | |
| 9,685,549 | B2 | 6/2017 | Okita et al. | |
| 9,799,760 | B2 | 10/2017 | Green et al. | |
| 9,899,507 | B2 | 2/2018 | Shirota et al. | |
| 10,249,506 | B2 | 4/2019 | Macelwee et al. | |
| 2008/0296618 | A1 | 12/2008 | Suh et al. | |
| 2011/0210377 | A1 | 9/2011 | Haeberlen et al. | |
| 2012/0175680 | A1 | 7/2012 | Suh et al. | |
| 2016/0233311 | A1* | 8/2016 | Masumoto | H10D 30/015 |
| 2016/0260817 | A1* | 9/2016 | Reiner | H10D 30/015 |
| 2017/0345922 | A1 | 11/2017 | Lucolano et al. | |
| 2020/0203549 | A1* | 6/2020 | Azize | H10D 30/475 |

FOREIGN PATENT DOCUMENTS

| | | | |
|---|---|---|---|
| CN | 103797581 | B | 9/2017 |
| CN | 106601825 | B | 12/2019 |
| CN | 112673478 | A | 4/2021 |
| DE | 102015114791 | | 3/2016 |
| EP | 1921669 | A1 | 5/2008 |
| EP | 2747143 | A1 | 6/2014 |
| JP | 2008235740 | A | 10/2008 |
| JP | 4700125 | B2 | 3/2011 |
| JP | 2012209374 | | 10/2012 |
| JP | 5566618 | B2 | 6/2014 |
| JP | WO2012157625 | A1 | 7/2014 |
| KR | 20120032258 | A | 4/2012 |
| KR | 101200274 | B1 | 11/2012 |
| WO | WO-2012157625 | A1 | 11/2012 |
| WO | WO-2023287456 | A1 | 1/2023 |

OTHER PUBLICATIONS

"International Application Serial No. PCT/US2022/011466, International Preliminary Report on Patentability mailed Jan. 25, 2024", 7 pgs.

"German Application Serial No. 11 2022 003 500.5, Office Action mailed Feb. 20, 2025", w/ English machine translation, 11 pgs.

"German Application Serial No. 112022003500.5, Response filed May 26, 2025 to Office Action mailed Feb. 20, 2025", w/ English Claims, 59 pgs.

"International Application Serial No. PCT/US2022/011466, International Search Report mailed May 9, 2022", 3 pgs.

"International Application Serial No. PCT/US2022/011466, Written Opinion mailed May 9, 2022", 5 pgs.

Yi, Pei, et al., "Study of the n+ GaN Cap in AlGaN/GaN High Electron Mobility Transistors with Reduced Source-Drain Resistance", Japanese Journal of Applied Physics, vol. 46, No. 9L, (Sep. 7, 2007), L842-L844.

"Chinese Application Serial No. 202280045368.2, Office Action mailed Sep. 1, 2026", w/o English Translation, 7 pgs.

* cited by examiner

HIGH CURRENT AND FIELD-MANAGED TRANSISTOR

CLAIM OF PRIORITY

This application claims priority to U.S. Provisional Patent Application No. 63/203,167, filed Jul. 12, 2021, which is hereby incorporated by reference herein in its entirety.

STATEMENT REGARDING FEDERALLY SPONSORED RESEARCH OR DEVELOPMENT

This invention was made with government support under Grant No. HR0011-18-3-0014 awarded by the Defense Advanced Research Projects Agency (DARPA). The government has certain rights in the invention.

CLAIM OF PRIORITY

This Application is a National Stage Application of PCT Application No. PCT/US2022/011466, filed on Jan. 6, 2022, and published as WO 2023/287456 A1 on Jan. 19, 2023, which claims priority to U.S. Provisional Patent Application No. 63/203,167, filed Jul. 12, 2021, which are hereby incorporated by reference herein in their entirety.

FIELD OF THE DISCLOSURE

This document pertains generally, but not by way of limitation, to semiconductor devices, and more particularly, to techniques for constructing gallium nitride devices.

BACKGROUND

Gallium nitride (GaN) based semiconductors offer several advantages over other semiconductors as the material of choice for fabricating the next generation of transistors, or semiconductor devices, for use in both high voltage and high frequency applications. GaN based semiconductors, for example, have a wide bandgap that enable devices fabricated from these materials to have a high breakdown electric field and to be robust to a wide range of temperatures.

The two-dimensional electron gas (2DEG) channels formed by GaN based heterostructures generally have high electron mobility, making devices fabricated using these structures useful in power-switching and amplification systems. GaN based semiconductors, however, are typically used to fabricate depletion mode (or normally on) devices, which can have limited use in many of these systems, such as due to the added circuit complexity required to support such devices.

SUMMARY OF THE DISCLOSURE

This disclosure describes a gallium nitride (GaN) semiconductor device, such as a field-effect transistor (FET), with a design that can enable the semiconductor device to handle high current and high voltage simultaneously.

In some aspects, this disclosure is directed to a method of forming a semiconductor device, the method comprising: forming a first semiconductor material layer over a second semiconductor material layer, wherein the first semiconductor material layer is more conductive relative to the second semiconductor material layer; etching away a portion of at least the first semiconductor material layer to expose a portion of the second semiconductor material layer; forming a barrier layer over the etched portion and the exposed portion of the second semiconductor material layer to form a heterostructure having a two-dimensional electron gas (2DEG) channel; and forming a gate contact over the barrier layer.

In some aspects, this disclosure is directed to a semiconductor device comprising: a first semiconductor material layer formed over a second semiconductor material layer, wherein the first semiconductor material layer is more conductive relative to the second semiconductor material layer; a barrier layer formed over an exposed portion of the second semiconductor material layer to form a heterostructure having a two-dimensional electron gas (2DEG) channel; a gate contact formed over the barrier layer; and drain and source contacts formed through the barrier layer and in contact with the first semiconductor material layer.

In some aspects, this disclosure is directed to a method of forming a semiconductor device, the method comprising: forming a first semiconductor material layer over a second semiconductor material layer to form a heterostructure having a two-dimensional electron gas (2DEG) channel, wherein 2DEG channel formed is more conductive than either the first semiconductor material layer or the second semiconductor material layer; etching away a portion of at least the first semiconductor material layer; forming a passivation layer over at least the etched away portion of the first semiconductor material layer; and forming a gate contact into the passivation layer.

In some aspects, this disclosure is directed to a semiconductor device comprising: a first semiconductor material layer formed over a second semiconductor material layer to form a heterostructure having a two-dimensional electron gas (2DEG) channel, wherein the 2DEG channel is more conductive than either the first semiconductor material layer or the second semiconductor material layer; a passivation layer formed over an etched away portion of the first semiconductor material layer; a gate contact formed into the passivation layer; and drain and source contacts formed through the passivation layer and in contact with the first semiconductor material layer.

BRIEF DESCRIPTION OF THE DRAWINGS

In the drawings, which are not necessarily drawn to scale, like numerals may describe similar components in different views. Like numerals having different letter suffixes may represent different instances of similar components.

The drawings illustrate generally, by way of example, but not by way of limitation, various embodiments discussed in the present document.

DETAILED DESCRIPTION

Power devices need to pass high drain-to-source current in the ON-state and permit high drain-to-source voltage in the OFF-state. The present inventors have recognized that these two requirements conflict, and devices with a high ON-state current often cannot support a high drain-to-source voltage.

This disclosure describes a gallium nitride (GaN) semiconductor device, such as a field-effect transistor (FET), with a design that can enable the semiconductor device to handle high current and high voltage simultaneously. For example, the device can have highly doped n-type N+ regions to ensure low contact resistance and high current. The semiconductor device can have a lightly conducting region next to the drain side of the gate contact, and the device can have a more highly conducting region further from the edge of the drain side of the gate contact. The semiconductor device can handle high current because of the low contact resistance and highly doped drain region but can handle a high electric field because of the lightly doped region near the drain edge of the gate contact. The semiconductor device can be formed in GaN by forming the original N+/N− structure, and then etching a portion of it away, and then regrowing the barrier layer.

As used in this disclosure, a GaN-based compound semiconductor material can include a chemical compound of elements including GaN and one or more elements from different groups in the periodic table. Such chemical compounds can include a pairing of elements from group 13 (i.e., the group comprising boron (B), aluminum (Al), gallium (Ga), indium (In), and thallium (TI)) with elements from group 15 (i.e., the group comprising nitrogen (N), phosphorus (P), arsenic (As), antimony (Sb), and bismuth (Bi)). Group 13 of the periodic table can also be referred to as Group III and group 15 as Group V. In an example, a semiconductor device can be fabricated from GaN and aluminum indium gallium nitride (AlInGaN).

Heterostructures described herein can be formed as AlN/GaN/AlN hetero-structures, InAlN/GaN heterostructures, AlGaN/GaN heterostructures, or heterostructures formed from other combinations of group 13 and group 15 elements. These heterostructures can form a two-dimensional electron gas (2DEG) at the interface of the compound semiconductors that form the heterostructure, such as the interface of GaN and AlGaN. The 2DEG can form a conductive channel of electrons that can be controllably depleted, such as by an electric field formed by a buried layer of p-type material disposed below the channel. The conductive channel of electrons that can also be controllably enhanced, such as by an electric field formed by a gate terminal disposed above the channel to control a current through the semiconductor device. Semiconductor devices formed using such conductive channels can include high electron mobility transistors.

Figure 1B:
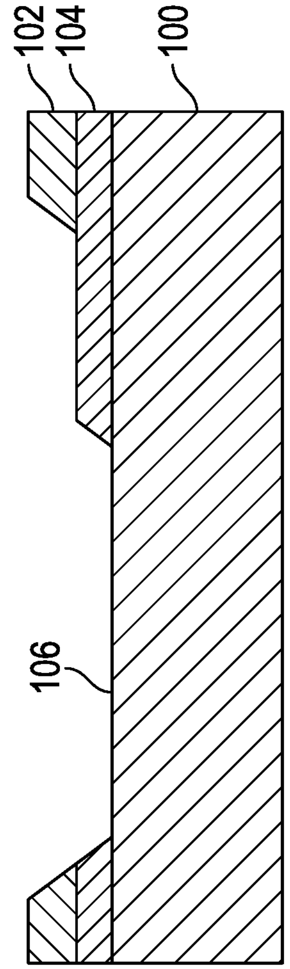
FIGS. 1A-1D depict an example of a process fabrication flow of forming a semiconductor device in accordance with various techniques of this disclosure.
Figure 1D:
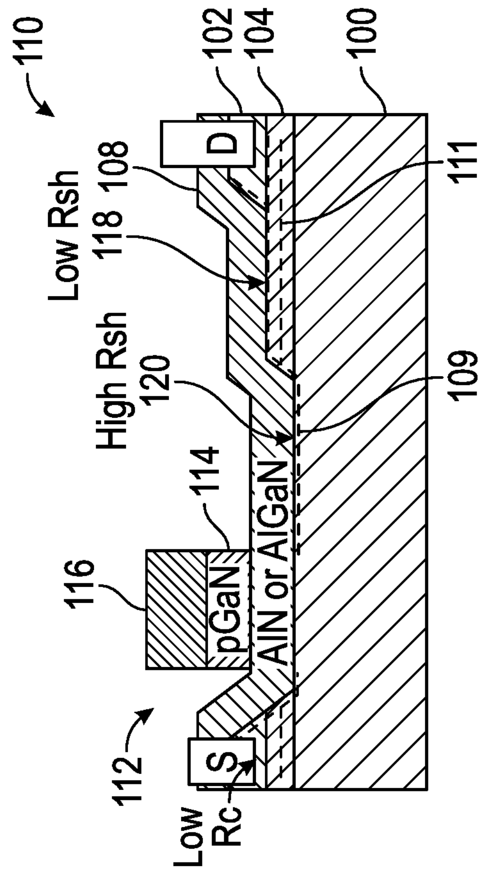
Figure 1A:
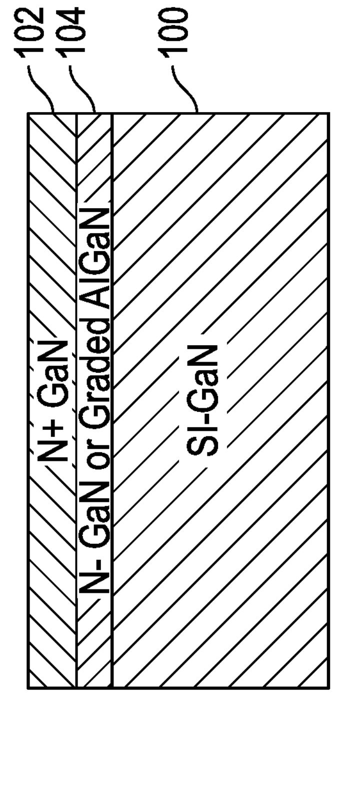

FIGS. 1A-1D depict an example of a process fabrication flow of forming a semiconductor device in accordance with various techniques of this disclosure. FIG. 1A depicts the starting materials that can be used in a first example flow. A first semiconductor material layer 100 can form a channel. In some examples, the first semiconductor material layer 100 can be semi-insulating GaN (SI—GaN), which is not intentionally doped. The first semiconductor material layer 100, e.g., SI—GaN, can be grown on a GaN buffer layer, which is grown on a substrate such as silicon carbide (SiC), silicon (Si), or sapphire.

A second semiconductor material layer 102 can be formed over the first semiconductor material layer 100. The second semiconductor material layer 102 can be highly conductive relative to the first semiconductor material layer 100, such as by using heavily doped n-type N+ GaN, such as having a concentration between about $10^{19}$ to $2\times10^{20}$ $cm^{-3}$. The second semiconductor material layer 102 can act to lower the contact resistance of the device, e.g., GaN FET.

As seen in FIG. 1A, the second semiconductor material layer 102 can be formed superjacent the first semiconductor material layer 100. In some examples, such as shown in FIG. 1A, the process fabrication flow can include forming a third semiconductor material layer 104 between the first semiconductor material layer 100 and the second semiconductor material layer 102. For example, the third semiconductor material layer 104 can include lightly doped N− GaN or graded aluminum gallium nitride (AlGaN). In some examples that use graded AlGaN (or $Al_xGa_{1-x}N$), the aluminum content can be varied between about 0% aluminum, such as at the interface between the first semiconductor material layer 100 and third semiconductor material layer 104, and about 30% aluminum, such as at the interface between the third semiconductor material layer 104 and the second semiconductor material layer 102, where the aluminum content gradually increases. The third semiconductor material layer 104 can be more conductive than the first semiconductor material layer 100 and less conductive than second semiconductor material layer 102.

Referring to FIG. 1B, a portion of at least the second semiconductor material layer 102 can be etched away, such as in the channel region of the device, to expose a portion 106 of the first semiconductor material layer 100. In the specific non-limiting example shown in FIG. 1B, a portion of the third semiconductor material layer 104 can also be etched away.

Figure 1C:
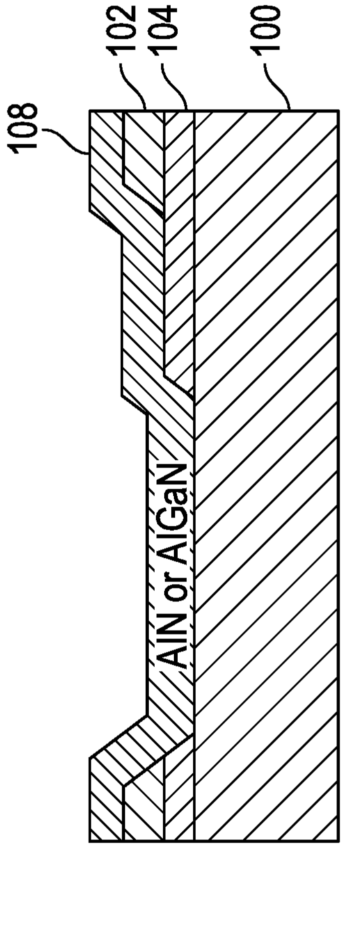

Referring to FIG. 1C, a barrier layer 108 can be formed, such as by regrowth, over the etched portion and the exposed portion 106 of the first semiconductor material layer 100 to form a heterostructure having a two-dimensional electron gas (2DEG) channel, as represented by the dashed line 109 in FIG. 1D. The barrier layer 108 can include aluminum nitride (AlN) or AlGaN, for example.

Finally, in FIG. 1D, the semiconductor device 110 can be completed, including forming agate contact 112 over the barrier layer 108. In some examples, forming the gate contact 112 over the barrier layer 108 can include forming a layer 114 over a portion of the barrier layer 108 and depositing an electrically conductive material 116 over the layer 114.

In some examples, the layer 114 can include p-type AlGaN or p-type GaN. Some such examples can be used to form an enhancement mode (or normally OFF) device, such as an enhancement mode power device. The p-type AlGaN or p-type GaN layer 114 can push electrons away in the 2DEG channel region directly beneath the gate contact 112, as represented by the break in the dashed line 109.

In FIG. 1D, a portion of the barrier layer 108 can be etched away and source (S) and drain (D) contacts can be formed over the etched away portions and in contact with the second semiconductor material layer 102.

There is often a tradeoff in some fabrication approaches between how high a threshold voltage $V_T$ can be achieved and the ON resistance $R_{ON}$ of the device (or how conductive the channel is). A conductive channel means that the charge density in the channel is high, which means that the threshold voltage of the device will be low.

Various techniques of this disclosure, such as in FIGS. 1A-1D, break the tradeoff of other fabrication approaches. The region of the first semiconductor material layer 100 under the p-type AlGaN or p-type GaN layer 114 can have a low charge density and the region of the first semiconductor material layer 100 to the right of the p-type AlGaN or p-type GaN layer 114 can have a high charge density. The semiconductor device 110 can be a power device that has a lower threshold voltage $V_T$ for a given ON resistance $R_{ON}$.

The p-type AlGaN or p-type GaN layer 114 has low charge per area and yet it needs to be able to deplete the 2DEG channel. As such, if there is a lot of charge in the 2DEG channel, the p-type AlGaN or p-type GaN layer 114 should be thick to deplete the 2DEG channel. However, if the p-type AlGaN or p-type GaN layer 114 is thick, its transconductance is low and so the capacitance between the electrically conductive material 116 and the 2DEG channel is small. As the voltage on the electrically conductive material 116 changes, not much charge is induced beneath it and so the resistance below the p-type AlGaN or p-type GaN layer 114 can be high. Using various techniques of this disclosure, the p-type AlGaN or p-type GaN layer 114 can be made thinner than with other approaches and therefore there will be a lower ON resistance for a given ON-state voltage below the p-type AlGaN or p-type GaN layer 114. A benefit of having the thinner p-AlGaN or p-GaN is having the higher transconductance, which means that it takes a smaller change in the gate voltage to have a similar change in drain-to-source current as a device with poor transconductance.

As indicated in FIG. 1D, the semiconductor device 110 can include a low sheet resistance ($R_{SH}$) region 118 (low charge density) and a high sheet resistance ($R_{SH}$) region 120 (high charge density), where the sheet resistances (or charge densities) are relative to one another. The use of the two regions of differing sheet resistances can assist in the management of the electric field in the channel of the GaN semiconductor device 110 by providing a variation in charge density in its 2DEG channel. The different sheet resistances can be achieved because of the interfacing of the materials as well as the semiconductor material in which the 2DEG channel is formed.

The undoped first semiconductor material layer 100, such as SI—GaN, can contribute few, if any electrons, to the 2DEG channel 109, with the barrier layer 108 contributing essentially all the electrons to the high sheet resistance ($R_{SH}$) region 120. In contrast, the second semiconductor material layer 102 and, if present, the third semiconductor material layer 104, both of which can be doped, can contribute electrons along with the barrier layer 108 in the low sheet resistance ($R_{SH}$) region 118 (denoted by the two dashed lines) to the 2DEG channel. This configuration can result in a lightly doped drain (LDD) structure, where the portion of the channel to the right of the gate contact 112 (toward the drain contact D) is more lightly doped than the region 111.

In addition, the semiconductor device 110 can have low contact resistance $R_C$, which can be due to the contribution of electrons from the second semiconductor material layer 102 or the third semiconductor material layer 104, if present, along with the barrier layer 108 (denoted by the two dashed lines). By using these techniques, a low contact resistance, high current semiconductor device 110 can be fabricated.

Although enhancement mode semiconductor devices, such as the semiconductor device 110 can be desirable for power applications, depletion mode (normally ON) semiconductor devices can be suitable for RF applications, such as shown in FIGS. 2A-2D.

Figure 2A:
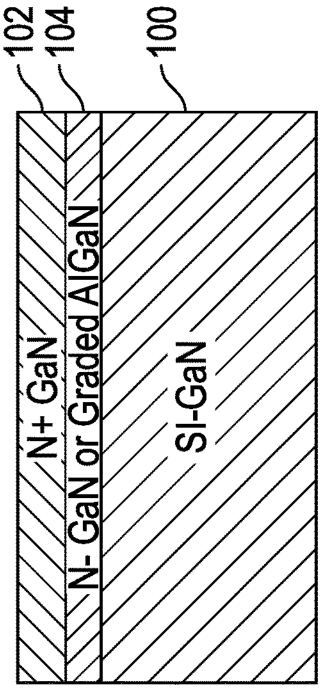
FIGS. 2A-2D depict another example of a process fabrication flow of forming a semiconductor device in accordance with various techniques of this disclosure.
Figure 2B:
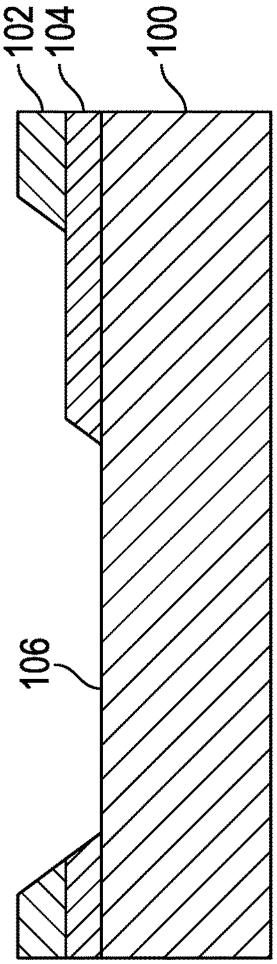
Figure 2C:
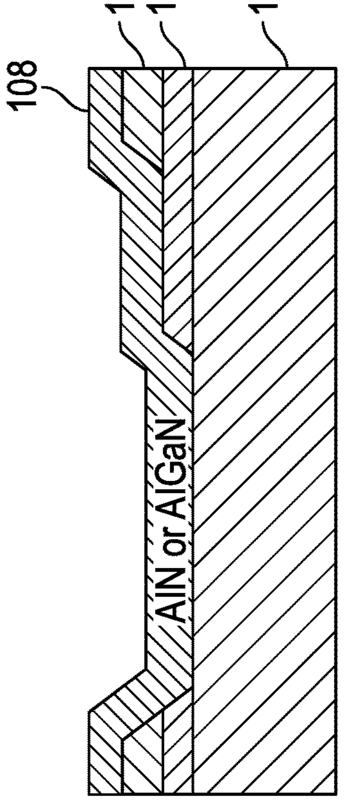

FIGS. 2A-2D depict another example of a process fabrication flow of forming a semiconductor device in accordance with various techniques of this disclosure. FIGS. 2A-2C are similar to FIGS. 1A-1C and, for purposes of conciseness, will not be described in detail again.

Figure 2D:
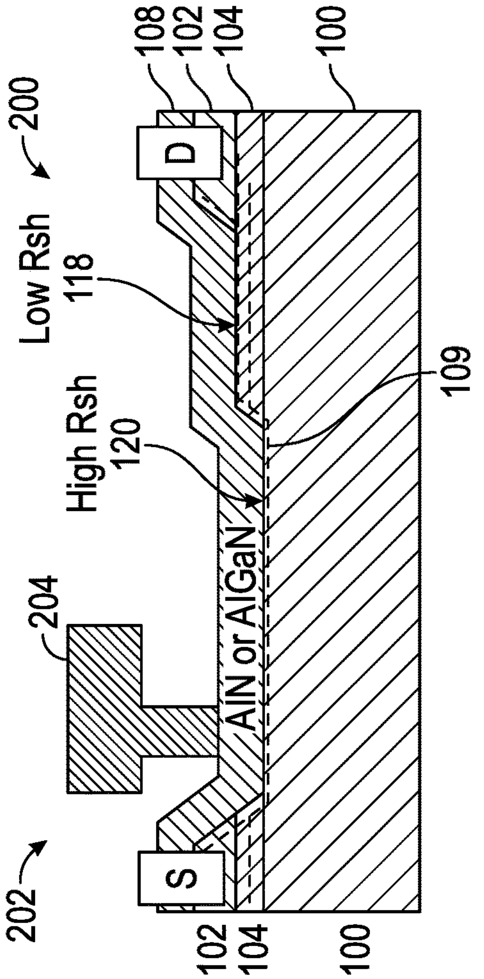

In FIG. 2D, the semiconductor device 200 can be completed, including forming a gate contact 202, e.g., a T-gate contact, over the barrier layer 108. In contrast to FIG. 1D, no layer of p-type AlGaN or p-type GaN is formed over a portion of the barrier layer 108 when forming the gate contact 202. Rather, the process can include depositing an electrically conductive material 204 over the barrier layer 108. Because no layer of p-type AlGaN or p-type GaN is formed over a portion of the barrier layer 108 when forming the gate contact 202, charges remain in the 2DEG channel under the gate contact 202, thereby forming a depletion mode semiconductor device 200.

In FIG. 2D, a portion of the barrier layer 108 can be etched away and source (S) and drain (D) contacts can be formed over the etched away portions and in contact with the second semiconductor material layer 102. The semiconductor device 200 can be suitable for RF applications.

FIGS. 3A-3D depict another example of a process fabrication flow of forming a semiconductor device in accordance with various techniques of this disclosure. FIGS. 3A-3D are similar to FIGS. 2A-2D except that the process fabrication flow of FIGS. 3A-3D do not include adding the third semiconductor material layer 104.

Figure 3A:
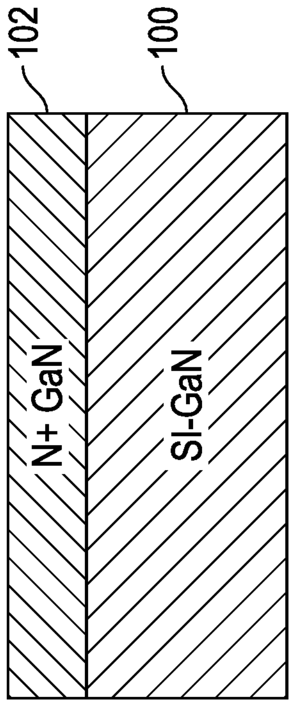
FIGS. 3A-3D depict another example of a process fabrication flow of forming a semiconductor device in accordance with various techniques of this disclosure.

FIG. 3A depicts the starting materials that can be used in the example flow. The first semiconductor material layer 100 can form a channel. In some examples, the first semiconductor material layer 100 can be semi-insulating GaN (SI—GaN), which is not intentionally doped. The first semiconductor material layer 100, e.g., SI—GaN, can be grown on a GaN buffer layer, which is grown on a substrate such as silicon carbide (SiC), silicon (Si), or sapphire.

A second semiconductor material layer 102 can be formed over the first semiconductor material layer 100. The second semiconductor material layer 102 can be highly conductive relative to the first semiconductor material layer 100, such as by using heavily doped n-type N+ GaN. The second semiconductor material layer 102 can act to lower the contact resistance of the device, e.g., GaN FET. As seen in FIG. 3A, the second semiconductor material layer 102 can be formed superjacent the first semiconductor material layer 100.

As described above, such as with respect to FIG. 1B, a portion of at least the second semiconductor material layer 102 can be etched away, such as in the channel region of the device, to expose a portion of the first semiconductor material layer 100. An example of the etching is shown in FIG. 3B.

Figure 3B:
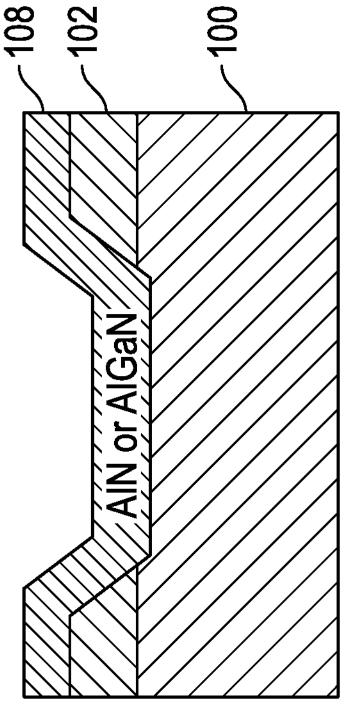

Referring to FIG. 3B, a barrier layer 108 can be formed, such as by regrowth, over the etched portion and the exposed portion of the first semiconductor material layer 100 to form a heterostructure having a 2DEG channel, as represented by the dashed line 109 in FIG. 2D. The barrier layer 108 can include aluminum nitride (AlN) or AlGaN, for example.

Figure 3C:
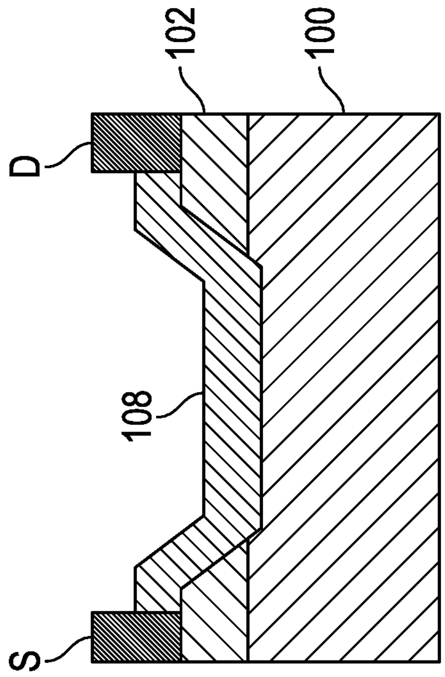

In FIG. 3C, a portion of the barrier layer 108 can be etched away and source (S) and drain (D) contacts can be formed over the etched away portions and in contact with the second semiconductor material layer 102.

Figure 3D:
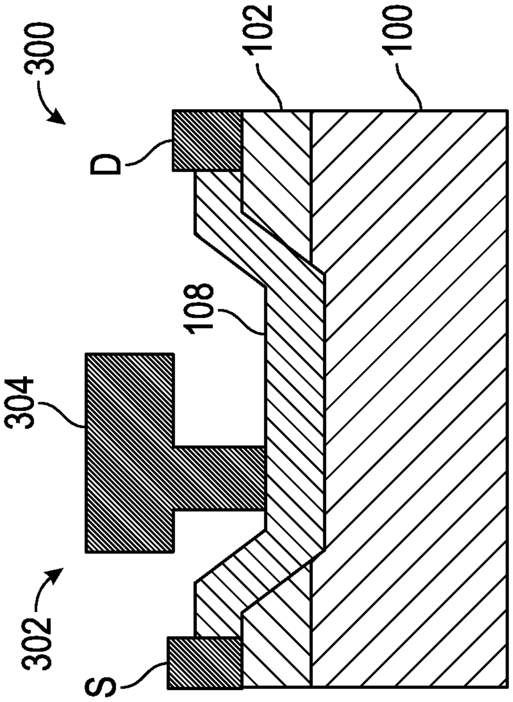

Finally, in FIG. 3D, the semiconductor device 300 can be completed, including forming a T-gate gate contact 302 over the barrier layer 108. Similar to FIG. 2D, no layer of p-type AlGaN or p-type GaN is formed over a portion of the barrier layer 108. Rather, the process can include depositing an electrically conductive material 304 over the barrier layer 108. Because no layer of p-type AlGaN or p-type GaN is formed in FIG. 3D, charges remain in the 2DEG channel under the gate contact 302, thereby forming a depletion mode semiconductor device 300. The semiconductor device 300 can be suitable for RF applications.

The lightly doped n-type N− GaN or graded aluminum gallium nitride (AlGaN) layer 104, such as in FIGS. 1A and 2A, can be used to increase the density of electrons in specific regions of the channel. The use of the two regions of differing charge densities can assist in the management of the electric field in the channel of the GaN semiconductor device 110. As described below, an alternative implementation can be used that takes advantage of the fact that the 2-dimensional electron gas density in an AlGaN/GaN structure is dependent on the thickness of the AlGaN layer.

Figure 4A:
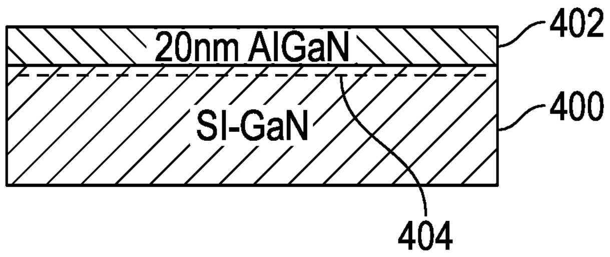
FIGS. 4A-4F depict another example of a process fabrication flow of forming a semiconductor device in accordance with various techniques of this disclosure.

FIGS. 4A-4F depict another example of a process fabrication flow of forming a semiconductor device in accordance with various techniques of this disclosure. FIG. 4A depicts the starting materials that can be used in a first example flow. A first semiconductor material layer 400 can be formed on a substrate, e.g., Si, SiC, sapphire, and the like. In some examples, the first semiconductor material layer 400 can be semi-insulating GaN (SI—GaN), which is not intentionally doped.

A second semiconductor material layer 402, such as AlGaN, can be formed over the first semiconductor material layer 400. When the second semiconductor material layer 402 is grown on the first semiconductor material layer 400, the 2DEG that forms at the interface of those layers is more conductive than either layer independently. In some examples, the second semiconductor material layer 402 can have a thickness between about 5 nanometers (nm) to about 25 nm, such as 20 nm. The aluminum content of the second semiconductor material layer 402 can be uniform, such as between about 15% and about 30%, such as about 23% aluminum. The second semiconductor material layer 402 can act to lower the contact resistance of the device, e.g., GaN FET. The first semiconductor material layer 400 and the second semiconductor material layer 402 form a heterostructure having a 2DEG channel, as represented by the dashed line 404 in FIG. 4A.

Figure 4B:
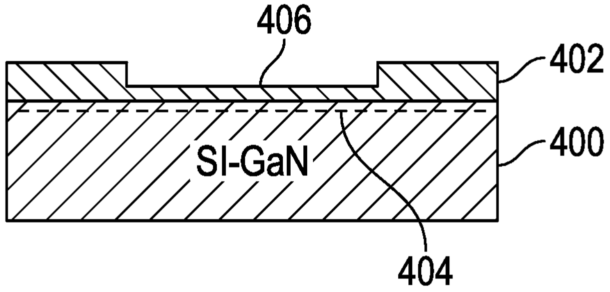

In FIG. 4B, a portion of the second semiconductor material layer 402 can be selectively patterned and etched away, leaving a recess etch 406. As a result, there will be fewer electrons under the recess etch 406 as compared to the regions of the second semiconductor material layer 402 to the right and left of the recess etch 406 where the AlGaN has not been etched away. The thinner region of the second semiconductor material layer 402 can have a higher sheet resistance than that of the thicker regions of the second semiconductor material layer 402. In this manner, an LDD structure in a semiconductor device can be fabricated with varying sheet resistances that do not involve the use of GaN or graded AlGaN, such as in FIGS. 1A-1D. As mentioned above, the varying sheet resistances can assist in the management of the electric field of the GaN semiconductor device 110 by providing a variation in charge density in its 2DEG channel.

Figure 4C:
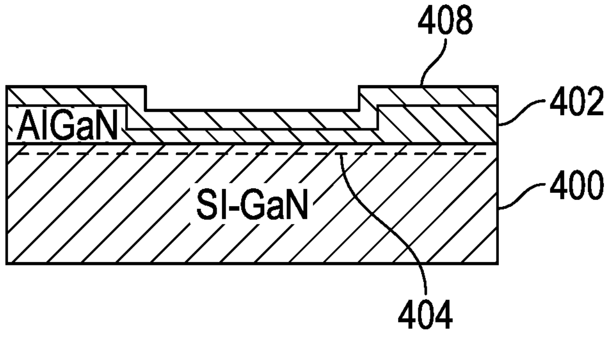

In FIG. 4C, a regrowth can be performed to add a passivation layer 408, such as using silicon nitride (SiN), such as having a thickness between about 5 nm to about 30 nm.

Figures 4D, 4E, 4F:
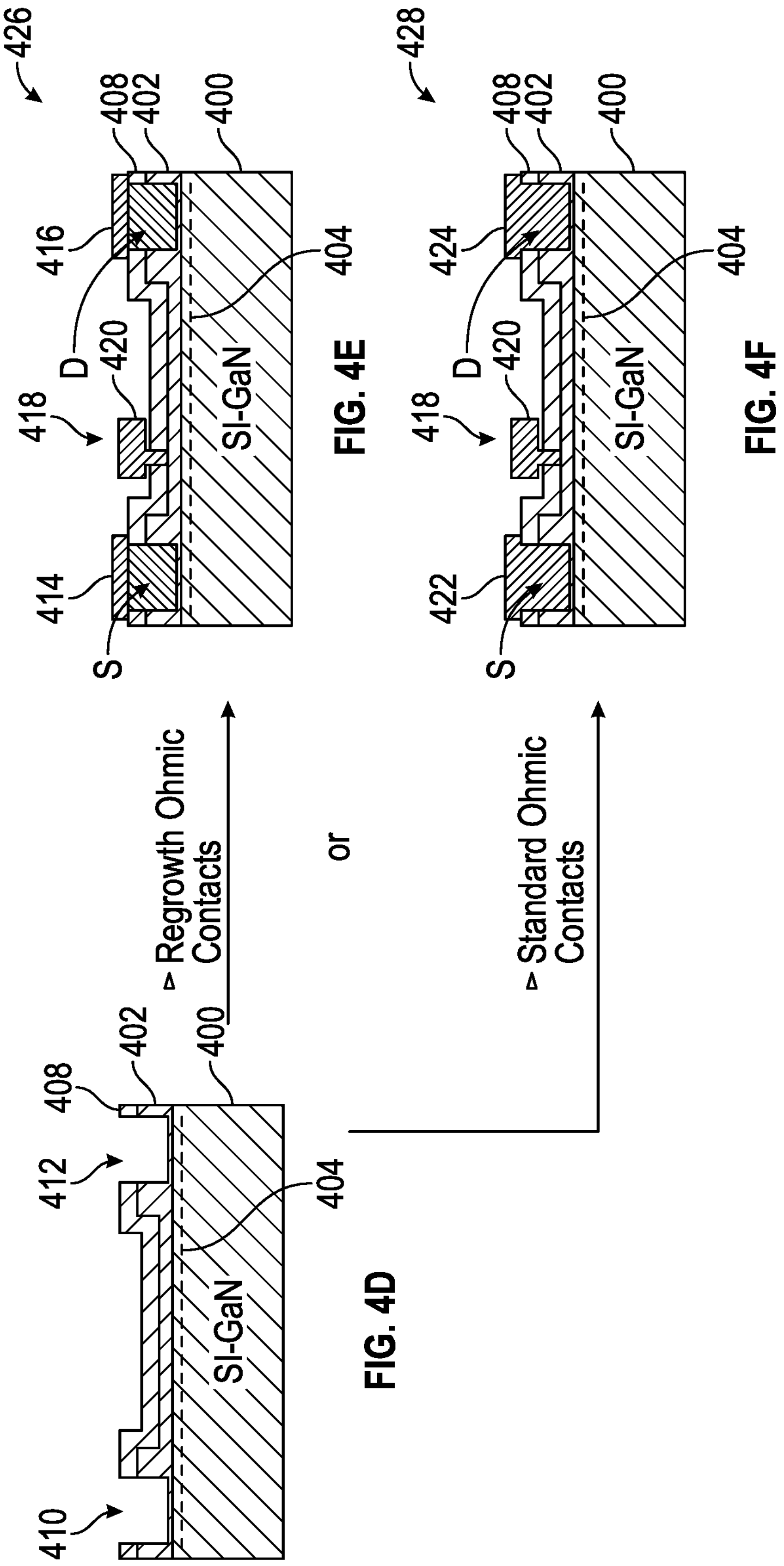

In FIG. 4D, a first region 410 of the passivation layer 408 and the second semiconductor material layer 402 and a second region 412 of the passivation layer 408 and the second semiconductor material layer 402 can be etched away for formation of the source and drain contacts.

In some examples, such as shown in FIG. 4E, the source contact (S) and the drain contact (D) can be formed by regrowth, such as by using highly conductive n-type N+ GaN, e.g., highly doped, within the first region 410 and the second region 412 to form ohmic contacts. Such regrowth of the ohmic contacts can reduce their contact resistance.

An electrically conductive material 414 can be deposited over the source contact (S) and an electrically conductive material 416 can be deposited over the drain contact (D). Examples of the electrically conductive material 414 can include gold, titanium, aluminum, titanium nitride, tungsten, and molybdenum. Finally, a gate contact 418 can be formed by depositing an electrically conductive material 420 into an etched away portion of the passivation layer 408. In some examples, the electrically conductive material 414, the electrically conductive material 416, and the electrically conductive material 420 can be the same material.

FIG. 4F depicts an alternative to the process flow in FIG. 4E. Rather than form the source and drain contacts using highly conductive N+ GaN, the source contact (S) and the drain contact (D) can be formed by depositing an electrically conductive material 422 and an electrically conductive material 424 within and above the first region 410 and the second region 412. Although the techniques in FIG. 4F provide low contact resistance, the contact resistance in FIG. 4F can be higher than that achieved using the techniques in FIG. 4E.

The semiconductor device 426 of FIG. 4E and the semiconductor device 428 of FIG. 4F can be used for both RF and power applications.

As indicated above with respect to FIG. 4B, a portion of the second semiconductor material layer 402 can be selectively patterned and etched away, leaving a recess etch 406. To etch away the portion of the second semiconductor material layer 402, the vacuum is broken and, as a result, the passivation layer 408 can no longer be grown in situ. The present inventors have recognized that this can result in irregularities at the interface between the second semiconductor material layer 402 and the passivation layer 408 that can degrade the performance of a finished semiconductor device. The present inventors have recognized these irregularities can be reduced or eliminated by regrowing another layer of AlGaN over the second semiconductor material layer 402 prior to regrowing the passivation layer 408, as described below with respect to FIGS. 5A-5F.

Figure 5A:
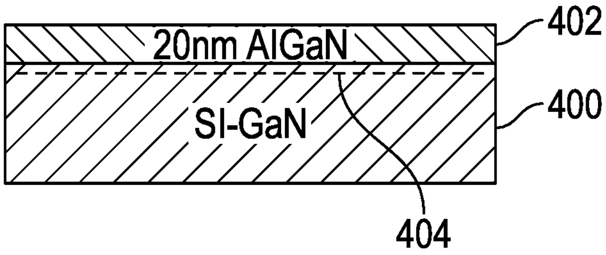
FIGS. 5A-5F depict another example of a process fabrication flow of forming a semiconductor device in accordance with various techniques of this disclosure.
Figure 5B:
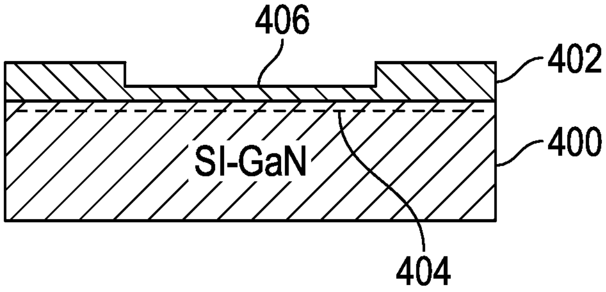

FIGS. 5A-5F depict another example of a process fabrication flow of forming a semiconductor device in accordance with various techniques of this disclosure. FIGS. 5A and 5B are similar to FIGS. 4A and 4B and, for purposes of conciseness, will not be described again.

Figure 5C:
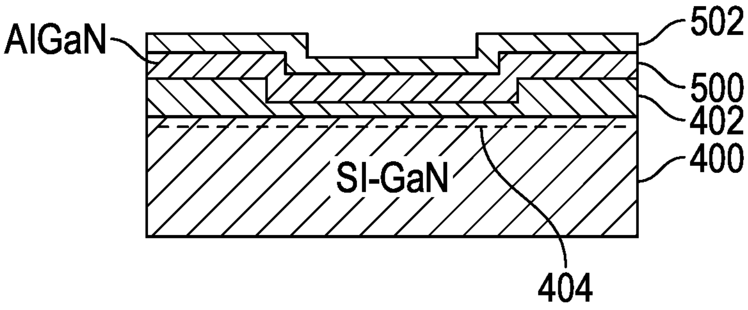

After the recess etch 406 is formed in FIG. 5B, the structure is placed back into the reactor and a regrowth is performed, as shown in FIG. 5C. In FIG. 5C, a third semiconductor material layer 500, e.g., of AlGaN, is regrown superjacent the etched second semiconductor material layer 402 and in situ, without breaking vacuum, a passivation layer 502 is regrown superjacent the third semiconductor material layer 500. Because the third semiconductor material layer 500 and the passivation layer 502 are regrown without breaking vacuum, the interface between the two layers is of very high quality without the irregularities that can be present using other approaches.

In some examples, the third semiconductor material layer 500 can include the same aluminum content as the second semiconductor material layer 402, such as between 0-30 aluminum, such as 23% aluminum. In some examples, the third semiconductor material layer 500 can have a thickness of between about 3 nm and about 15 nm.

Figures 5D, 5E, 5F:
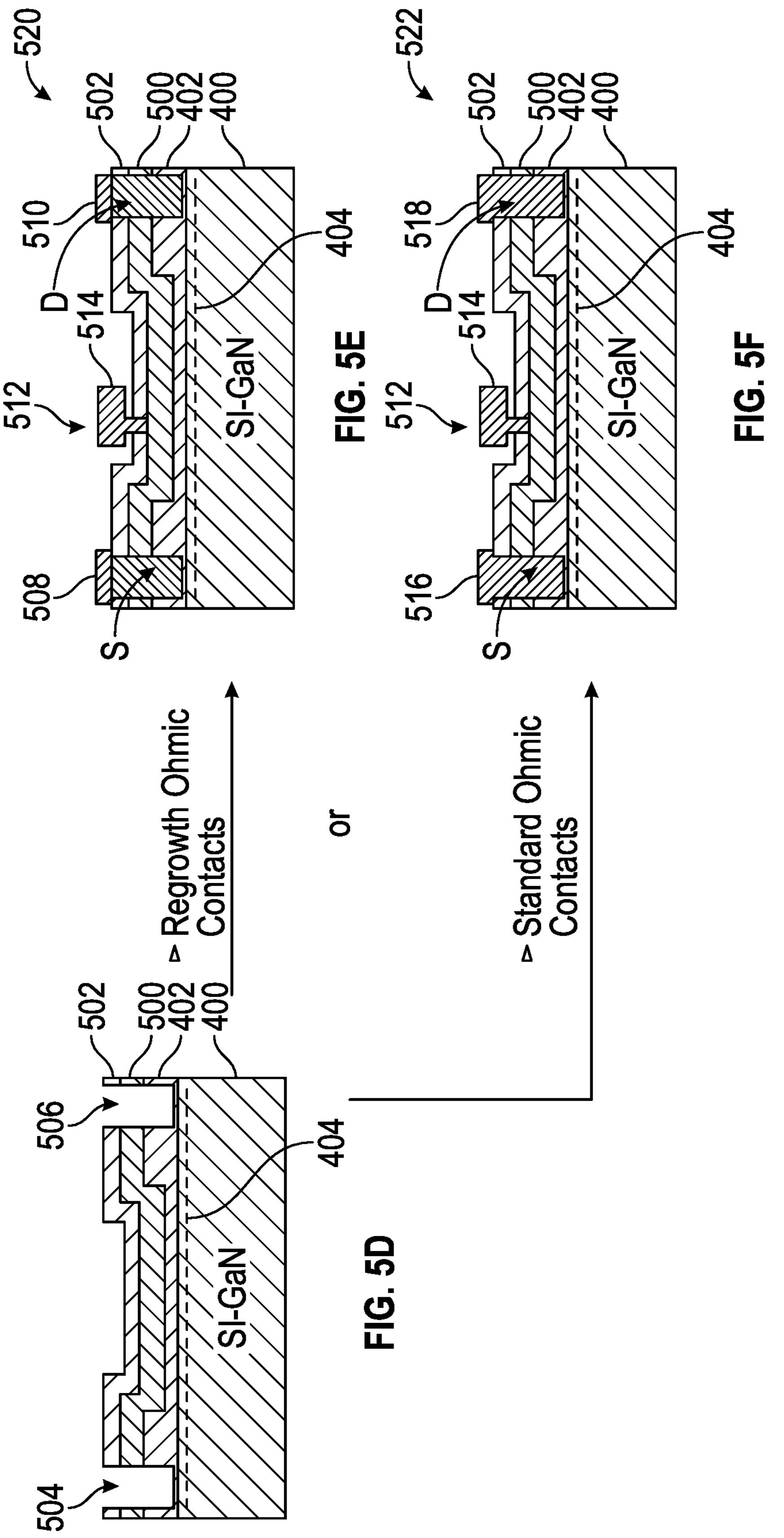

In FIG. 5D, a first region 504 of the passivation layer 502, the third semiconductor material layer 500, and the second semiconductor material layer 402 and a second region 506 of the passivation layer 502, the third semiconductor material layer 500, and the second semiconductor material layer 402 can be etched away for formation of the source and drain contacts.

In some examples, such as shown in FIG. 5E, the source contact (S) and the drain contact (D) can be formed by regrowth, such as by using highly conductive N+ GaN, e.g., highly doped, within the first region 504 and the second region 506 to form ohmic contacts. Such regrowth of the ohmic contacts can reduce their contact resistance.

An electrically conductive material 508 can be deposited over the source contact (S) and an electrically conductive material 510 can be deposited over the drain contact (D). Finally, a gate contact 512 can be formed by depositing an electrically conductive material 514 into an etched away portion of the passivation layer 502. In some examples, the electrically conductive material 508, the electrically conductive material 510, and the electrically conductive material 514 can be the same material.

FIG. 5F depicts an alternative to the process flow in FIG. 5E. Rather than form the source and drain contacts using highly conductive N+ GaN, the source contact (S) and the drain contact (D) can be formed by depositing an electrically conductive material 516 and an electrically conductive material 518 within and above the first region 504 and the second region 506. Although the techniques in FIG. 5F provide low contact resistance, the contact resistance in FIG. 5F can be higher than that achieved using the techniques in FIG. 5E.

The semiconductor device 520 of FIG. 5E and the semiconductor device 522 of FIG. 5F can be used for both RF and power applications.

The techniques described above allow the formation of a transistor. e.g., GaN FET, that can simultaneously handle both a high current and a high voltage.

Figure 6:
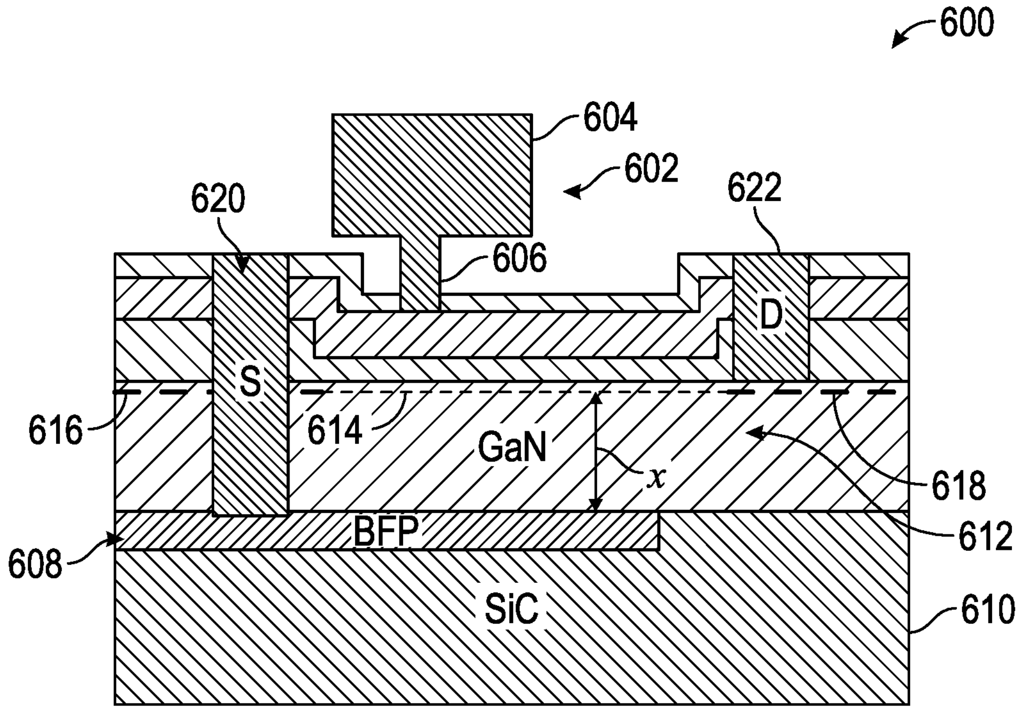
FIG. 6 is a cross-sectional view of an example of a semiconductor device that can be formed using various techniques of this disclosure.

FIG. 6 is a cross-sectional view of an example of a semiconductor device that can be formed using various techniques of this disclosure. The device 600 can include various features, summarized below, that can improve its performance over other approaches.

The device can include a T-gate contact 602. As seen in FIG. 6, the T-gate contact 602 is shaped like the letter T. The large gate head 604 helps lower the gate resistance. The small gate base 606 defines the footprint of the gate contact and permits faster switching and higher current.

Unlike other approaches in which the gate contact is embedded within or sits upon a dielectric material, the gate head 604 is not supported by a dielectric material. The lack of dielectric material can result in less parasitic capacitance and thus a faster device. However, there is no dielectric material to support a topside field plate so the electric field in the channel cannot be managed from the top of the device. A field plate (topside or backside) can help smooth the electric field in the channel and prevent high electric field peaks from damaging the device and reducing reliability, robustness, breakdown voltage, and increasing dynamic on-resistance.

To manage the electric field in the device 600, a backside field plate 608 can be included. The backside field plate 608 can be a conductive or doped region within the GaN layer or the substrate 610, e.g., Si—C, which are underneath the device. In some examples, the backside field plate 608 can include AlN that in combination with GaN, will form a 2DEG channel. In other examples, a dopant can be implanted into the substrate 610. The dopant can be annealed such that the implanted portion is more conductive than the substrate 610 and then the additional substrate layers can be regrown above the substrate 610.

The resistance of the backside field plate 608 can be designed to maximize the benefit of the backside field plate. It can be useful to calculate the frequency limit of the backside field plate f_BFP=1/(R_BFP*C_BFP-Drain), where R_BFP is the resistance between the drain-edge of the backside field plate 608 and the source, and C_BFP-Drain is the capacitance between the drain and the backside field plate. The resistance R_BFP can be designed such that it is very low so that f_BFP is much greater than the frequency of operation, and therefore the backside field plate is grounded at the frequency of operation. Alternatively, the resistance R_BFP can be designed to be smaller such that f_BFP is less than the frequency of operation. In this second case, the backside field plate will be grounded at lower frequencies, but floating at the frequency of operation. In the second case, the backside field plate can reduce the electric field at low frequencies, and therefore can improve the reliability of the device, but will not hurt the frequency performance of the device, such as the gain or the power added efficiency.

Because the electric field in the channel can be managed from the backside, there is no need for a topside field plate. However, the effectiveness of the backside field plate 608 can decrease as the distance x in FIG. 6 increases or the 2DEG concentration become larger.

The electric field in the channel 612 can also be managed by using lightly doped drain (LDD) techniques. By reducing the 2DEG concentration only in a small region 614 of the channel 612, as compared to region 616 and region 618, the 2DEG channel region that needs to be managed by the backside field plate 608 can also be reduced without significantly sacrificing the ON resistance $R_{ON}$. That is, the LDD techniques of this disclosure allow the charge density to be reduced in one region 614 so that the backside field plate 608 works effectively while also maintaining a high charge density in the other regions 616, 618 so that that the ON resistance $R_{ON}$ can remain low.

In addition to the above techniques, the use of ohmic contacts 620 and 622, e.g., chemical mechanical polishing (CMP) ohmic contacts, permit the length of the gate-to-source distance Lgs to be reduced. Ohmic contacts can be flat; they do not need a head made of conductive material. With such a planar structure, the Lgs dimension can be reduced thereby allowing, for example, higher charge density, higher currents, and lower resistances. In a power device, the reduction in the Lgs dimension can result in a lower ON-resistance and, in an RF device, the switching frequency can increase.

As the Lgs dimension is reduced, the magnitude of the electric fields can increase. However, the use of the backside field plate 608 and/or the use of the LDD techniques described can allow management of the newly increased electric fields without the use of dielectric materials or a topside field plate.

Finally, the techniques described above in FIG. 6 can desirable be performed in a silicon-compatible fabrication plant. Many commercial GaN devices are manufactured in gold-compatible fabrication plants. Silicon-compatible fabrication plants are generally cleaner than gold-compatible fabrication plants, which can improve the performance of any resulting device. In addition, silicon-compatible fabrication plants use deposition and etching techniques to add metal to the devices, rather than the lift-off techniques often used in gold-compatible fabrication plants. The lift-off techniques may not be as clean or high yield as the deposition and etching techniques used commonly in silicon-compatible fabrication plants.

Various Notes

Each of the non-limiting aspects or examples described herein may stand on its own or may be combined in various permutations or combinations with one or more of the other examples.

The above detailed description includes references to the accompanying drawings, which form a part of the detailed description. The drawings show, by way of illustration, specific embodiments in which the invention may be practiced. These embodiments are also referred to herein as "examples." Such examples may include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B." unless otherwise indicated. In this document, the terms "including" and "in which" are used as the plain-English equivalents of the respective terms "comprising" and "wherein." Also, in the following aspects, the terms "including" and "comprising" are open-ended, that is, a system, device, article, composition, formulation, or process that includes elements in addition to those listed after such a term in an aspect are still deemed to fall within the scope of that aspect. Moreover, in the following aspects, the terms "first," "second." and "third," etc. are used merely as labels, and are not intended to impose numerical requirements on their objects.

Method examples described herein may be machine or computer-implemented at least in part. Some examples may include a computer-readable medium or machine-readable medium encoded with instructions operable to configure an electronic device to perform methods as described in the above examples. An implementation of such methods may include code, such as microcode, assembly language code, a higher-level language code, or the like. Such code may include computer readable instructions for performing various methods. The code may form portions of computer program products. Further, in an example, the code may be tangibly stored on one or more volatile, non-transitory, or non-volatile tangible computer-readable media, such as during execution or at other times. Examples of these tangible computer-readable media may include, but are not limited to, hard disks, removable magnetic disks, removable optical disks (e.g., compact discs and digital video discs), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments may be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the aspects. Also, in the above Detailed Description, various features may be grouped together to streamline the disclosure. This should not be interpreted as intending that an unclaimed disclosed feature is essential to any aspect. Rather, inventive subject matter may lie in less than all features of a particular disclosed embodiment. Thus, the following aspects are hereby incorporated into the Detailed Description as examples or embodiments, with each aspect standing on its own as a separate embodiment, and it is contemplated that such embodiments may be combined with each other in various combinations or permutations. The scope of the invention should be determined with reference to the appended aspects, along with the full scope of equivalents to which such aspects are entitled.

The claimed invention is:

1. A method of forming a semiconductor device, the method comprising:

forming a first semiconductor material layer over a second semiconductor material layer, wherein the first semiconductor material layer is more conductive relative to the second semiconductor material layer;

etching away a portion of at least the first semiconductor material layer to expose a portion of the second semiconductor material layer;

forming a barrier layer over the etched portion and the exposed portion of the second semiconductor material layer to form a heterostructure having a two-dimensional electron gas (2DEG) channel; and forming a gate contact over the barrier layer.

2. The method of claim 1, wherein forming the gate contact over the barrier layer includes:

forming a layer over a portion of the barrier layer; and depositing an electrically conductive material over the layer.

3. The method of claim 2, wherein forming the layer over the portion of the barrier layer includes:

forming a layer of p-type aluminum gallium nitride over the portion of the barrier layer.

4. The method of claim 2, wherein forming the layer over the portion of the barrier layer includes:

forming a layer of p-type gallium nitride over the portion of the barrier layer.

5. The method of claim 1, wherein forming the gate contact over the barrier layer includes:

depositing an electrically conductive material over a portion of the barrier layer.

6. The method of claim 1, wherein the first semiconductor material layer includes n-type gallium nitride, and wherein the first semiconductor material layer is more conductive than the second semiconductor material layer.

7. The method of claim 1, further comprising:

forming a third semiconductor material layer between the first semiconductor material layer and the second semiconductor material layer.

8. The method of claim 7, wherein the first semiconductor material layer includes n-type gallium nitride, wherein the third semiconductor material layer includes n-type gallium nitride, wherein the first semiconductor material layer is more conductive than the third semiconductor material layer, and wherein the third semiconductor material layer is more conductive than the second semiconductor material layer.

9. The method of claim 1, comprising:

etching away portions of the barrier layer; and forming drain and source contacts over the etched away portions and in contact with the first semiconductor material layer.

* * * * *